(12) United States Patent
Hasegawa

(10) Patent No.: US 6,175,278 B1
(45) Date of Patent: Jan. 16, 2001

(54) VARIABLE GAIN AMPLIFIER CIRCUIT

(75) Inventor: Jun Hasegawa, Kurokawa-gun (JP)

(73) Assignee: Fuji Photo Film Co., Ltd., Kanagawa (JP)

( * ) Notice: Under 35 U.S.C. 154(b), the term of this patent shall be extended for 0 days.

(21) Appl. No.: 09/318,751

(22) Filed: May 26, 1999

(30) Foreign Application Priority Data

May 28, 1998 (JP) ................................................ 10-148036

(51) Int. Cl.[7] .................................................... H03G 3/30
(52) U.S. Cl. .......................................... 330/278; 330/288
(58) Field of Search .................................. 330/278, 279, 330/284, 288; 348/678, 707

(56) References Cited

U.S. PATENT DOCUMENTS 5,530,404 * 6/1996 Debroux ............................... 330/278
5,917,380 * 6/1999 Darthenay et al. ................... 330/278

FOREIGN PATENT DOCUMENTS 2-34205    8/1990  (JP) .

* cited by examiner

Primary Examiner—Steven J. Mottola
(74) Attorney, Agent, or Firm—Sughrue, Mion, Zinn, Macpeak & Seas, PLLC

(57) ABSTRACT

A variable gain amplifier circuit has: a voltage-current conversion unit for converting an input voltage into a current and outputting the current; a current amplifier for amplifying the current at a set variable gain; a converter for converting the amplified current into an output voltage; and an operating point setting unit for setting an operating point so that the output voltage converges into a predetermined range during a period while a reference voltage is input.

41 Claims, 11 Drawing Sheets

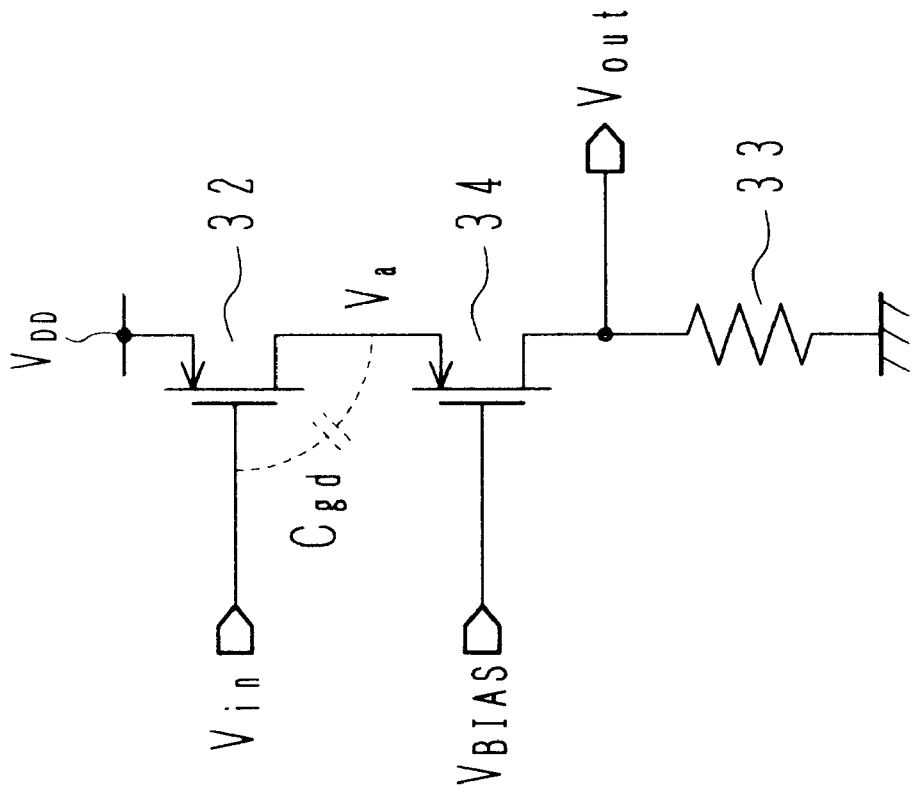
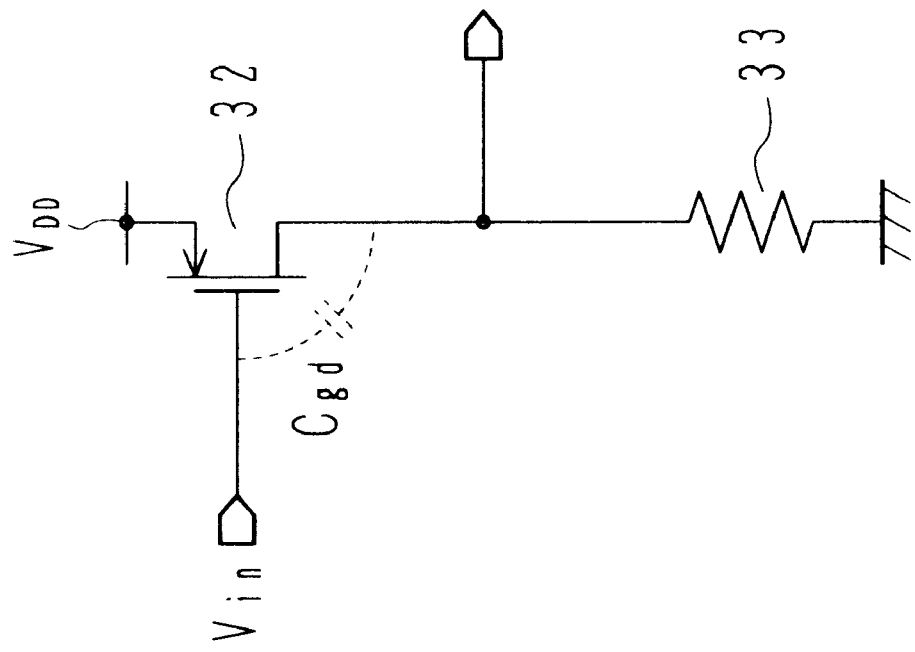

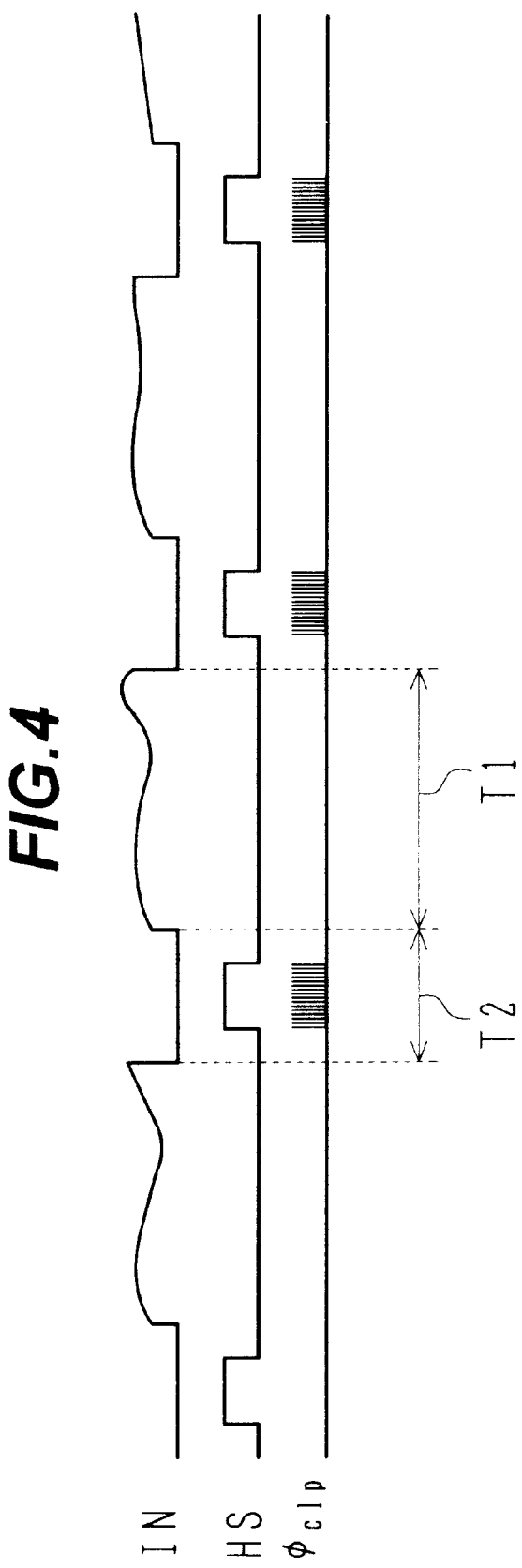

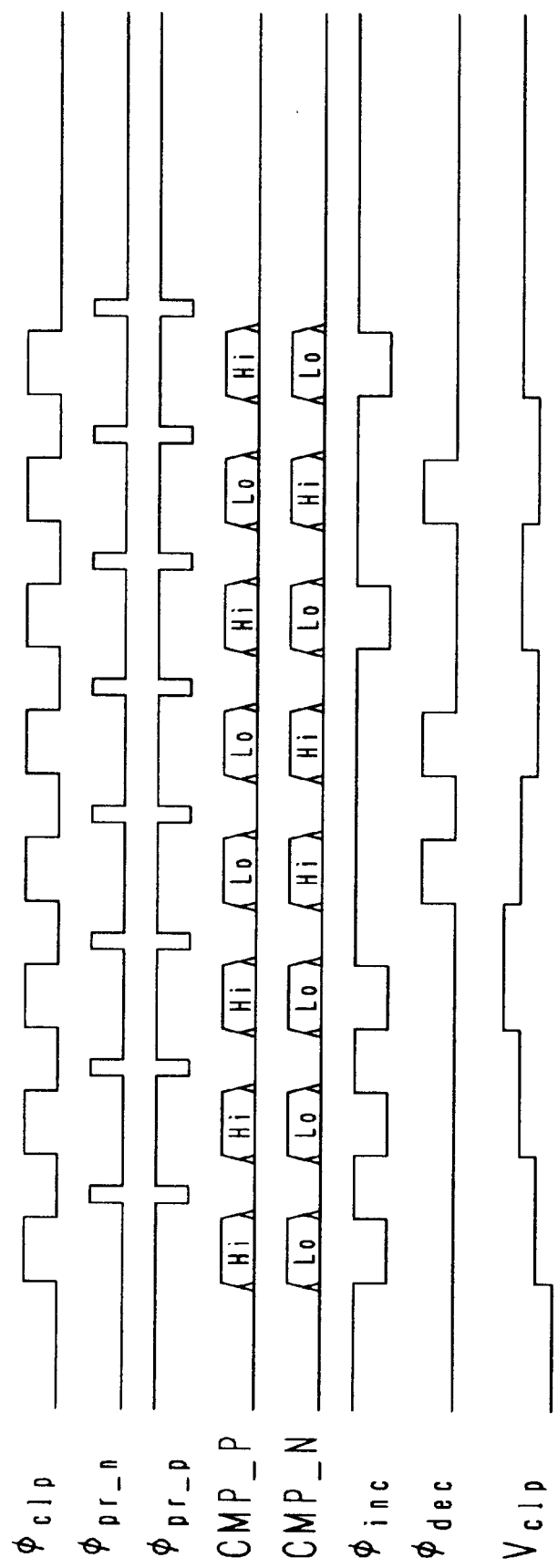

VARIABLE GAIN AMPLIFIER CIRCUIT

This application is based on Japanese patent application No. 10-148036 filed on May 28, 1998, the entire contents of which are incorporated herein by reference.

BACKGROUND OF THE INVENTION a) Field of the Invention

The present invention relates to a variable gain amplifier circuit, and more particularly to a variable gain amplifier circuit suitable for use with a CMOS integrated circuit which processes an image signal.

b) Description of the Related Art

A variable gain amplifier circuit such as shown in FIG. 11 has been proposed as cited in JP-B-2-34205 as a prior art. This variable amplifier uses an operational amplifier 100 as an inverter amplifier and can change an amplifier gain by changing a resistance ratio of an input resistor 101 to a feedback resistor 102.

The input resistor 101 is made of a ladder resistor network of an eight-stage structure having resistors R and 2R. A gain is determined by a combination of turned-on switches. Namely, an input voltage Vin is amplified by the operational amplifier 100 and output as an output voltage Vout at a gain determined by a combination of switches 103 whose contacts are connected to the inverting input terminal of the operational amplifier 100 (on-state switches 103).

In the variable gain amplifier circuit shown in FIG. 11 according to a related art, the operational amplifier 100 is required to have a very high gain-bandwidth product (GB product) if both the gain and bandwidth necessary for image signal processing are to be satisfied. It is therefore very difficult to practically realize a variable gain amplifier circuit for image signal processing by using CMOS integrated circuit techniques.

As apparent from the circuit shown in FIG. 11, if the input voltage Vin is replaced by a reference voltage Vref, this variable gain amplifier circuit is quite the same as a D/A converter which converts a digital signal constituted of bits S1 to S8 into an analog signal Vout.

SUMMARY OF THE INVENTION

It is an object of the present invention to provide a variable gain amplifier circuit having a wide bandwidth and a high amplification factor.

It is another object of the present invention to provide a variable gain amplifier circuit capable of switching between operating points at high speed and with high stability.

According to one aspect of the present invention, there is provided a variable gain amplifier circuit comprising: voltage-current conversion means for converting an input voltage into a current and outputting the current; current amplifying means for amplifying the current at a set gain; means for converting the amplified current into an output voltage; and operating point setting means for setting an operating point so that the output voltage converges into a predetermined range during a period while a reference voltage is input.

A variable gain amplifier circuit suitable for image signal processing can be obtained. This variable gain amplifier circuit can be easily fabricated with CMOS circuits and satisfies necessary operation bandwidth, maximum gain, and variable gain setting resolution.

BRIEF DESCRIPTION OF THE DRAWINGS

FIGS. 3A and 3B are equivalent circuit diagrams illustrating the effects of cascode connection transistors of the first embodiment.

FIG. 4 is a timing chart of an image signal and other signals.

FIG. 7 is an operation timing chart of the voltage adjusting circuit.

DETAILED DESCRIPTION OF THE PREFERRED EMBODIMENTS

Figure 1:
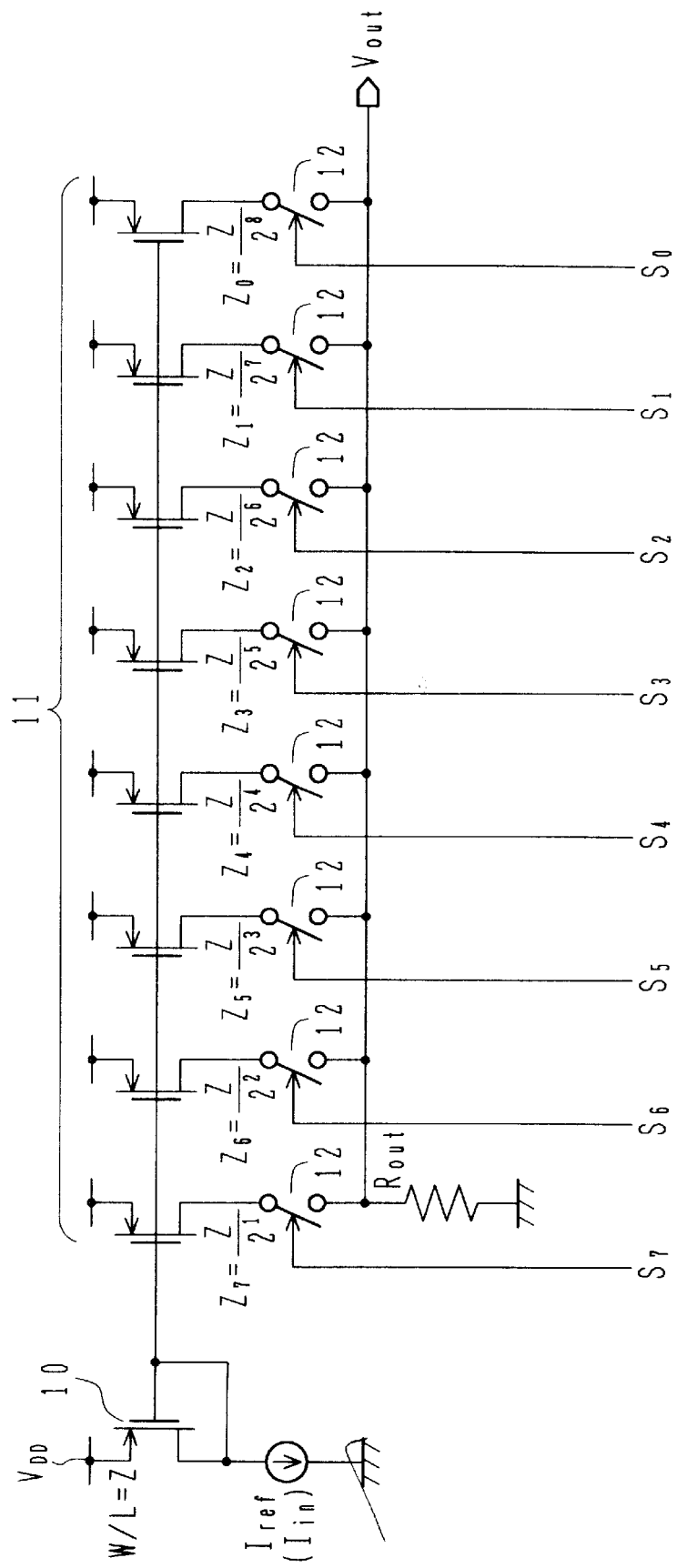
FIG. 1 is a circuit diagram of a D/A converter which is used for illustrating the operation principle of variable gain amplifier circuits according to embodiments of the invention.

FIG. 1 is a circuit diagram of a D/A converter which is used for explaining the principle of variable gain amplifier circuits according to embodiments of the invention. This D/A converter is of a binary weight current source type. A p-type metal-oxide-semiconductor (MOS) transistor 10 has a source connected to a power source voltage terminal $V_{DD}$, a drain connected to a ground terminal via a current source of current $I_{ref}$, and a gate connected to the drain. Eight p-type MOS transistors 11 have gates all connected to the gate of the transistor 10, sources all connected to the power source voltage terminal $V_{DD}$, and drains each connected to a corresponding one end of eight switches 12. The other ends of the eight switches 12 are connected to the ground terminal via a load resistor $R_{out}$, and to an output terminal of an output voltage Vout. The eight switches 12 are controlled by eight-bit signals $S_0$ to $S_7$ to be turned on and off.

The MOS transistor 10 has a conductivity of Z=gate width W/gate length L. A reference current Iref flows through the input MOS transistor 10. The output transistor 11 of a common gate connection multi (eight) stage structure has a conductivity of $Z_i$=gate width W/gate length L. While the reference current Iref flows through the MOS transistor 10, a current of Iref multiplied by $Z_i/Z$ by current mirror flows through the transistor 11.

The conductivity $Z_i$ (W/L) of each output transistor 11 is binary-weighted. For example, in the circuit shown in FIG. 1, the eight output transistors 11 have conductivities $Z_7=Z/2^1$, $Z_6=Z/2^2$, $Z_5=Z/2^3$, $Z_4=Z/2^4$, $Z_3=Z/2^5$, $Z_2=Z/2^6$, $Z_1=Z/2^7$, and $Z_0=Z/2^8$, in this order from the left to right. The conductivity $Z_i$ can be changed by changing, for example, the gate width W.

The eight switches 12 are controlled by the eight-bit signals $S_0$ to $S_7$. If the signals $S_0$ to $S_7$ are "1", the corresponding switches 12 are closed. During the on-state (closed state) of each switch 12, the transistor 11 is connected to the output terminal and current flows through the transistor. The currents flowing through the transistors 11 are $1/2^1$, $1/2^2$, $1/2^3$, $1/2^4$, $1/2^5$, $1/2^6$, $1/2^7$, and $1/2^8$ of the reference current Iref, in this order from the left to right. The total current flowing through the on-state transistors 12 flows through the load resistor Rout so that the output voltage Vout obtained by the voltage drop across the load resistor Rout is given by the following equation (1).

$$Vout = Iref \times Rout \times \Sigma(Sn \times 2^n)/2^N$$

$$\Sigma \text{ for } n=0 \text{ to } N-1 \tag{1}$$

where N is the number of stages of the transistors, e.g., 8. Sn is a control bit for each transistor. This D/A converter can convert the 8-bit digital signals $S_0$ to $S_7$ into an analog output signal Vout.

Consider now that the reference current Iref is replaced by an input current Iin in the equation (1). An input voltage Vin is converted into an input current Iin by voltage-current converting means, and the input current Iii is supplied to the circuit shown in FIG. 1. The D/A converter is therefore changed to a variable gain amplifier circuit. If the voltage-current conversion relation is represented by Iin=Vin/Ri where Ri is an input resistance, the following equation (2) can be obtained from the equation (1).

$$Vout = Vin \times Rout/Ri \times \Sigma(Sn \times 2^n)/2^N$$

$$\Sigma \text{ for } n=0 \text{ to } N-1 \tag{2}$$

The following definition (3) is introduced.

$$\Sigma(Sn \times 2^n)/2^N = k$$

$$\Sigma \text{ for } n=0 \text{ to } N-1 \tag{3}$$

Then, the equation (2) can be expressed by the following equation (4).

$$Vout = k \times Rout/Ri \times Vin \tag{4}$$

If N is 8, i.e., if the number of stages of the transistors 11 is 8, the value k is in the range from 0/256 to 255/256 ($\approx$1). A variable gain amplifier circuit can be obtained which has a maximum gain Vout/Vin of about Rout/Ri and a gain setting resolution of about 1/256 of the maximum gain.

The circuit shown in FIG. 1 can therefore change the gain in the range from 0 to the maximum gain at a step of about 1/256 of the maximum gain, by turning on and off the switches 12 in response to the control signals $S_0$ to $S_7$. The embodiment shown in FIG. 1 is not limited to the eight-stage structure of the transistors 11. Obviously, the number N of stages of transistors 11 and the number of switches corresponding to the stages may be selected as desired to set an optional variable gain range.

A variable gain amplifier circuit according to a first embodiment will be described with reference to FIG. 2. A p-channel MOS transistor 26, eight p-channel MOS transistors 27, eight switches 28 and eight-bit signals $S_0$ to $S_7$ correspond to the transistor 10, transistors 11, switches 12 and signals $S_0$ to $S_7$ shown in FIG. 1.

A video source VS is, for example, a solid state image pickup device which supplies an image signal to an input terminal IN. A voltage supplied to the input terminal IN is input to the non-inverting input terminal (+) of an operational amplifier 20. An output of the operational amplifier 20 is input to the gate of an n-channel MOS transistor 21. The source of the transistor 21 is connected to a resistor 22 (Rin) at a point A and a voltage at the source of the transistor 21 is fed back to the inverting input terminal (−) of the operational amplifier 20.

The source of the transistor 21 is connected via the resistor 22 to a ground terminal 8. The transistor 21 and resistor 22 form a source follower. An output of the source follower or the potential at the point A is fed back to the operational amplifier 20 so that the potential at the point A becomes equal to the voltage Vin at the input terminal IN. A current Iin flowing through the resistor 22 having a resistance value of Rin is given by the following equation (5).

$$Iin = Vin/Rin \tag{5}$$

The drain of the p-channel MOS transistor 23 is connected to the point A, the gate thereof is applied with a voltage Vclp output from a voltage adjusting circuit 24 to be later detailed, and the source thereof is connected via a resistor 25 having a resistance value Rbp to a power source voltage $V_{DD}$ terminal to form a source follower. A current flowing through this source follower is determined by Vclp, a threshold voltage Vth of the transistor 23 and the resistance value Rbp of the resistor 25, as given by the following equation (6).

$$Ibp \approx (Vclp - Vth)/Rbp \tag{6}$$

If the voltage Vclp is constant, the current Ibp is constant so long as the transistor 23 operates as a pentode, irrespective of what potential the point A has. The transistor can be considered as a constant current source controlled by the voltage Vcp. Since the current flowing through the transistor 23 and resistor 25 is Ibp, a current Isig flowing through the p-channel MOS transistor 26 is given by the following equation (7).

$$Isig = Iin - Ibp \tag{7}$$

The transistor 26 is, so-called, diode-connected with the drain and gate being connected together with the common source configuration. The a.c. signal component at the source is zero. Therefore, the potential at a point C applied to the gate of the transistor 26 having a conductivity Z=W/L makes the current Isig flow through the transistor 26. The potential at the point C is also applied to the gate of the P-type transistors 27 (27-1 to 27-8) each having the conductivity Zi=W/L with the common source configuration. The a.c. signal component at the source is zero. Under the conditions that the transistor 27 operates as a pentode, the drain current given by the following equation (8) flows.

$$I = Zi \times Isig \tag{8}$$

As the voltage at the point C is applied to the gate of each of the transistors 27-1 to 27-8 and if the switch 28 connected to the drain of each transistor 27-1 to 27-8 is in an on-state, a current corresponding to the conductivity Zi=W/L flows through each transistor 27-1 to 27-8. The following Table shows the relation between the conductivity Zi=W/L of each transistor 27-1 to 27-8 and a current flowing through the transistor.

TABLE

| Transistors | W/L | Current |
|---|---|---|
| 27-1 | 16 × Z | 16 × Isig |
| 27-2 | 8 × Z | 8 × Isig |
| 27-3 | 4 × Z | 4 × Isig |
| 27-4 | 2 × Z | 2 × Isig |
| 27-5 | Z | Isig |
| 27-6 | Z/2 | Isig/2 |
| 27-7 | Z/4 | Isig/4 |
| 27-8 | Z/8 | Isig/8 |

The switch 28 connected to each transistor 27 is controlled to be turned on and off by the gain setting bits $S_7$ to $S_0$. If the gain setting bit Sn ($S_7$ to $S_0$) is "1", the corresponding switch 28 (28-1 to 28-8) turns on, whereas if it is "0", the corresponding switch 28 turns off. A current Iout flowing through the load resistor 29 having a resistance value of Rout is given by the following equation (9) by using the gain setting bit Sn.

$$Iout = Isig \times \Sigma(Sn \times Z \times 2^{n-4})/Z$$
$$= 2^4 \times Isig \times \Sigma(Sn \times 2^n)/2^8$$
$$= k \times 2^4 \times Isig$$
$$\Sigma \text{ for } n=0 \text{ to } 7 \qquad (9)$$

A voltage drop across the load resistor 29 (Rout) by this output current Iout corresponds to an output voltage Vout which is given by the following equation (10).

$$Vout = Rout \times Iout \qquad (10)$$

After the equations (5) and (7) are substituted into the equation (9), the equation (9) rearranged is substituted into the equation (10) so that the relation between the input and output voltages is given by the following equation (11).

$$Vout = k \times 2^4 \times Rout \times Isig$$
$$= (k \times 2^4 \times Rout/Rin) \times Vin - Vofs \qquad (11)$$

where a definition of $Vofs \equiv 1 \times 2^4 \times Rout \times Ibp$ is introduced.

As seen from the above equation (11), a change in the output voltage relative to a change in the input voltage, i.e., a gain (Vout/Vin), is expressed as $k \times 2^4 \times Rout/Rin$. If the resistance values are set to satisfy Rout/Rin=2, the maximum gain is 32 which is sufficient for a variable gain amplifier circuit for image signal processing. In this case, the gain resolution has a pitch of 0.125 (⅛) because of the eight-bit resolution (N=8) used in this embodiment. If a ten-bit resolution (N=10) is used, the gain resolution has a pitch of 0.03125, which is sufficient for a variable gain amplifier circuit for imaging signal processing. These values of Rout, Rin and N are set as desired in accordance with the necessary maximum gain and gain resolution.

Figure 2:
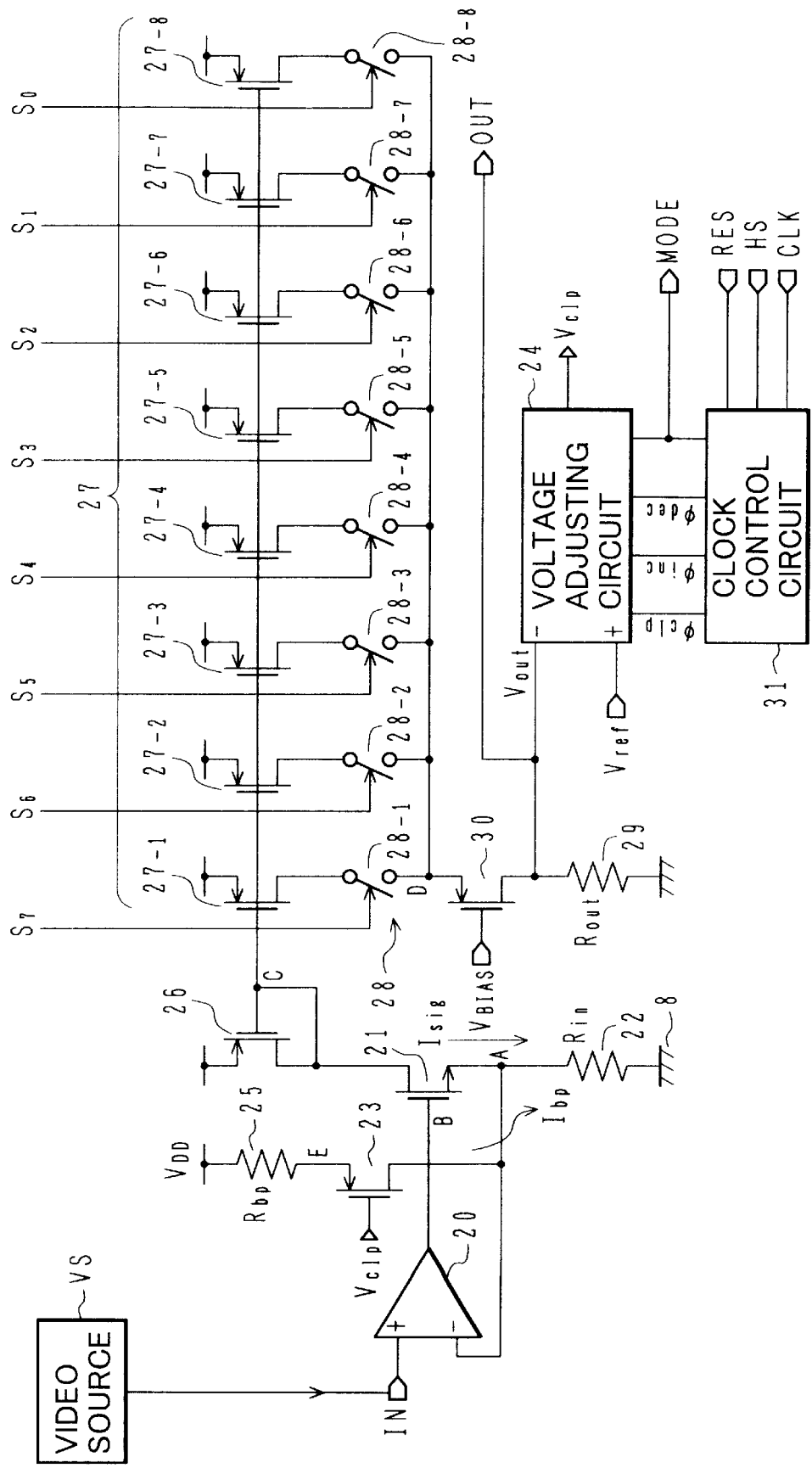
FIG. 2 is a circuit diagram of a variable gain amplifier circuit according to a first embodiment of the invention.

In the circuit shown in FIG. 2, a p-type MOS transistor 30 is a cascode connected transistor which prevents the operation bandwidth from being narrowed by a Miller capacitance. The equivalent circuits with and without this transistor 30 are shown in FIGS. 3A and 3B for the comparison sake. The transistor 30 has a gate applied with a constant voltage $V_{BIAS}$, a source connected to the other end of the switch, and a drain connected to the output terminal OUT. The output terminal OUT is connected via the resistor 29 to the ground terminal.

In the equivalent circuit shown in FIG. 3A, a p-type MOS transistor (corresponding to the transistor 27 shown in FIG. 2) 32 and a load resistor (corresponding to the resistor 29 shown in FIG. 2) 33 constitute an inverter. A change in the input Vin potential (corresponding to the potential at the point C in FIG. 2) is inversely amplified to form a large change in the output Vout potential. The transistor 32 has a parasitic capacitance Cgd between the gate and drain or between the input and output. If this capacitor Cgd exists between the input and output of the inverter, a large Miller capacitance of $Cmil=(1-A) \times Cgd$ exists as viewed from the input terminal, where A is an amplification factor.

A change in the potential at the point C shown in FIG. 2 corresponding to the input Vin shown in FIG. 3A is very small in the order of mV. The output voltage Vout is generally amplified to about 1 V so that the amplification factor A is set as $A=-Vout/Vin=-100$. Therefore, the Miller capacitance Cmil is as large as 100 times or more of the parasitic capacitance between the gate and drain of the transistor 27 (27-1 to 27-8), as viewed from the input diode-connected transistor 26 (FIG. 2). Since the output impedance of this diode-connected transistor 26 is relatively high, the time constant determined by the output impedance and the Miller capacitor becomes so large as not permitted by an image signal processing circuit.

If a cascode-connected transistor (corresponding to the transistor 30 shown in FIG. 2) 34 is inserted as shown in the equivalent circuit of FIG. 3B, the parasitic capacitance Cgd exists between the potentials Vin and Va. A transmission gain of Vin to Va (A=-Va/Vin) is approximately -1. This reason will be described in the following.

The following equations are obtained through a small signal (of a.c. component) analysis, where gm1 is a mutual conductance of the transistor 32, gm2 is a mutual conductance of the transistor 34, and i is a change amount in the current flowing through the transistors 32 and 34. The minus sign indicates reduction is signal voltage, and in current.

$i = -gm1 \times (Vin - V_{DD}) = -gm1 \times (Vin - 0)$
$= -gm1 \times Vin$
$i = -gm2 \times (B_{BIAS} - Va) = -gm2 \times (0 - Va)$
$= gm2 \times Vq$ From the above two equations, $gm2 \times Va = -gm1 \times Vin$ or $Va/Vin = -gm1/gm2$. If $gm1 \approx gm2$, the transmission gain A of Vin for Va is "-1".

Therefore, the Miller capacitance Cmil is about two times of the parasitic capacitance Cgd as given by $Cmil=(1-A) \times Cgd \approx 2 \times Cgd$. The time constant becomes short and the operation bandwidth becomes considerably broad as compared to the circuit without the transistor 34.

Next, the voltage adjusting circuit 24 will be described. In this embodiment, an output voltage Vclp of the voltage adjusting circuit 24 is applied to the gate of the transistor 23. The voltage Vclp applied to the gate controls the current Ibp flowing through the resistor 22 (Rin) to limit the current Isig flowing through the transistors 21 and 26. This current Ibp becomes a bypass current.

In this embodiment, the operating point of an input voltage is set to about 2 V. If this bypass current path (transistor 23 controlled by the voltage Vclp and resistor 25) is not provided, the current Rin flowing through the resistor 22 becomes 400 μA if the resistance value Rin of the resistor 22 is 5 kΩ and the resistance value Rout of the load resistor 29 is 10 kΩ. If the switches 28 are all turned on, a current 32 as large as 32 times of the current Iin flowing through the resistor 22 flows through the load resistor 29. The output voltage Vout is therefore 400 μA×32×10 kΩ128 V. The output voltage Vout is limited by the power source voltage and the circuit does not operate normally.

To avoid this, it is necessary to control to set the output voltage Vout to a predetermined operating point (output operation reference voltage value) when the input voltage Vin is set to a predetermined operating point (input operation reference voltage value). The voltage Vclp is controlled to obtain the current Isig which sets the output current Iout to the predetermined output operating point, by bypassing the current Ibp through the bypass current path constituted of the transistor 23 controlled by the voltage Vclp and resistor 25.

A current amplification factor changes with a set gain. Therefore, the bypass current is controlled in accordance with the set gain. If the input voltage Vin is set to an operating point Vin0 and the output voltage Vout is set to an operating point Vout0, then the following equation (12) is derived from the equation (11).

$$Vofs = (k \times 2^4 \times Rout/Rin) \times Vin0 - Vout0 \qquad (12)$$

From the definition of Vofs≡k×2⁴ Rout×Ibp, the equation (12) is arranged as the following equation (13) according to which the bypass current Ibp is controlled.

$$Ibp = Vin0/Rin - Vout0/(k \times 2^4 \times Rout) \qquad (13)$$

A control method for this bypass current will be described. FIG. 4 is a timing chart of image signals input to the variable gain amplifier circuit of the embodiment. An image signal IN alternately repeats an image signal output period T1 during which effective image information is supplied and a blanking period T2 during which no image signal is supplied. A voltage during the blanking period T2 corresponds to an input operating point. A voltage during the effective image signal output period T1 uses the voltage during the blanking period T2 as a reference voltage. The variable gain amplifier circuit adjusts an output operating point during the blanking period T2, i.e., during a period while the reference voltage is input.

As a basic operation, the voltage adjusting circuit 24 compares a voltage Vref representative of the a target output operating point with an output voltage Vout during the blanking period T2, and if the output voltage Vout is lower than the target reference voltage Vref, it slightly raises the gate voltage Vclp of the transistor 23.

As the voltage Vclp rises, the current Ibp flowing through the bypass current path reduces and the current Isig increases. As the current Isig increases, the current Iout flowing through the output load resistor 29 increases by current mirror. As the output current Iout increases, a voltage drop across the load resistor 29 (Rout) becomes large and the output voltage Vout becomes slightly higher than the initial voltage. Conversely, if the output voltage Vout is higher than the target reference voltage Vref, the gate voltage Vclp of the transistor 23 is lowered slightly and the output voltage Vout lowers correspondingly.

This adjustment operation for the output voltage Vout is discretely (intermittently) executed synchronously with clocks φclp supplied from a clock control circuit 31 to the voltage adjusting circuit 24. As shown in the flow chart of FIG. 4, a signal HS is used for permitting an operating point adjustment operation and takes a high level in the blanking period T2. The docks φclp are output only during a period while the signal HS takes the high level. The operating point may take a point shifted from the target operating point immediately after the power is turned or a different gain is set. As the clocks φclp are input, the voltage adjusting circuit 24 operates to converge the output voltage Vout to the target operating point.

Figure 5:
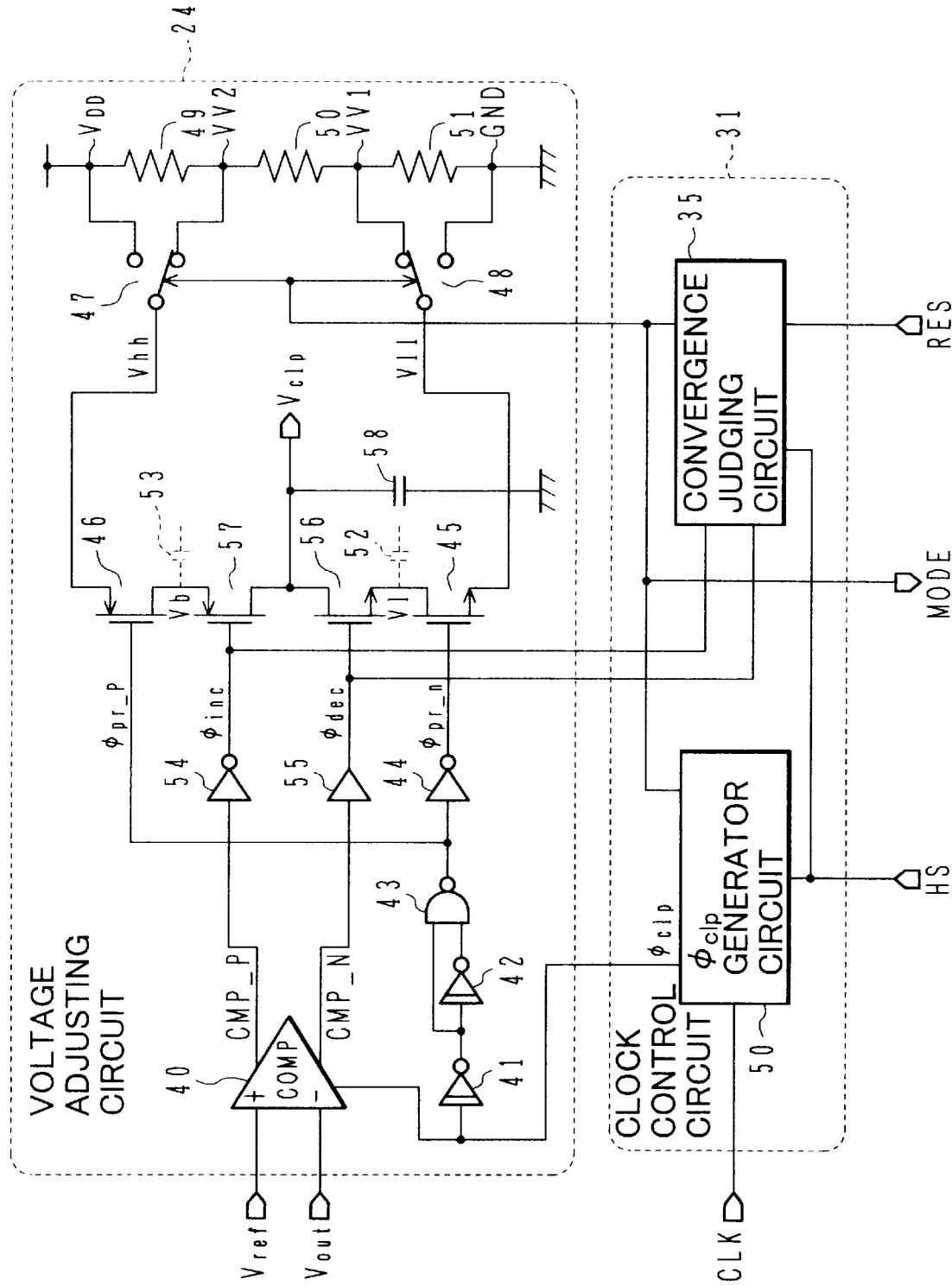
FIG. 5 is a circuit diagram showing the details of a voltage adjusting circuit and a clock control circuit of the first embodiment.

The details of the voltage adjusting circuit 24 and clock control circuit 31 are shown in FIG. 5. The two signals Vref and Vout to be compared with each other are input to a comparator 40 in the voltage adjusting circuit 24. The comparator 40 is also supplied with the clock signal φclp from a φclp generator circuit 50 in the clock control circuit 31.

Figure 6:
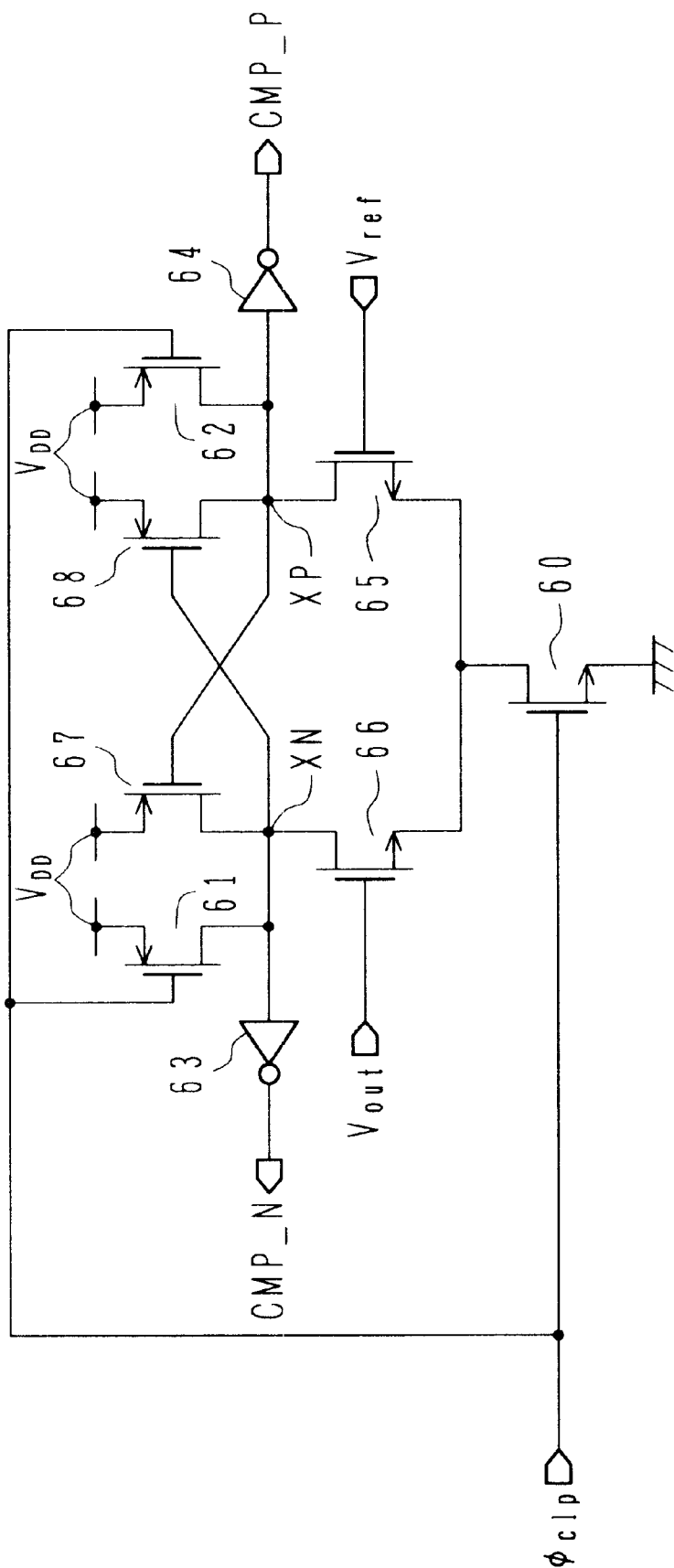
FIG. 6 is a circuit diagram of a comparator circuit of the first embodiment.

The comparator 40 has the structure shown in FIG. 6. While the clock φclp takes a low level, an n-type MOS transistor 60 is in the off-state and current will not flow therethrough. At this time, p-type MOS transistor 61 and 62 are both in the on-state so that the voltages at XN and XP points are $V_{DD}$. Therefore, the output of amplifiers (inverters) 63 and 64, i.e., outputs CMP_N and CMP_P of the comparator 40, take the low level.

As the clock φclp takes the high level, the n-type MOS transistor 60 is in the on-state so that the p-type MOS transistors 61 and 62 are both in the off-state. As the transistor 60 is turned on, the n-type MOS transistors 65 and 66 operate to enter the on-state so that current starts flowing and the voltages at the XN and XP points start lowering. If the target reference voltage Vref is higher than the output voltage Vout, the on-resistance of the transistor 65 is lower than that of the transistor 66 so that the potential at the XP point becomes lower than that at the XN point. Since the XJ and XP points are connected to the gates of the p-type MOS transistors 67 and 68, as the potential at the XP point lowers, the on-resistance of the transistor 67 lowers to thereby raise the potential at the XN point, whereas as the potential at the XN point rises, the on-resistance of the transistor 68 increases to thereby lower the potential at the XP point.

These operations are positive feedback so that the potential at the XN point rises quickly and the potential at the XP point lowers quickly. The XN and XP points are connected to the amplifiers 63 and 64. Therefore, if the voltage Vref is higher than the output voltage Vout when the clock φclp changes from the low to high level, the signal CMP_P takes the high level quickly and the signal CMP_N takes the low level quickly to thus output a judgment result. Conversely, if the output voltage Vout is higher than the voltage Vref, the signal CMP-P takes the low level and the signal CMP_N takes the high level.

FIG. 7 is a timing chart illustrating an operation of the voltage adjusting circuit 24. With reference to this timing chart, the operation of the circuit shown in FIG. 5 will be described further. The clock φclp is supplied to a delay inverter 41 which has a relatively long delay time for timing adjustment. An output of the delay inverter 41 is input to a delay inverter 42. Outputs of the delay inverters 41 and 42 are input to a NAND gate 43 which outputs a pulse φpr-p.

An output of the NAND gate 43 is supplied to an amplifier (inverter) 44 which outputs a pulse φpr-n inverted from the pulse φr-p. The pulses φr-n and φr-p are supplied respectively to the gates of an n-type MOS transistor 45 and a p-type MOS transistor 46. The source of the transistor 45 is supplied with a voltage Vll selected by a MODE signal to be described later. The source of the transistor 46 is supplied with a voltage Vhh selected by the MODE signal.

Switches 47 and 48 are controlled by the MODE signal. Resistors 49, 50 and 51 are serially connected to supply voltages VV2 and VV1 by dividing the power source voltage $V_{DD}$. The voltage Vll takes the ground potential (GND) when the MODE signal is high, and takes the voltage VV1 slightly higher than the ground potential when the MODE signal is low. The voltage Vhh takes the voltage $V_{DD}$ when the MODE signal is high, and takes the voltage VV2 slightly lower than the voltage $V_{DD}$.

As the high level pulse φpr-n and low level pulse φpr-p are applied respectively to the gates of the transistors 45 and 46 during the period while the clock φclp takes the low level, the transistors 45 and 46 are turned on. A capacitor 52 connected to the drain of the transistor 45 is charged to the potential Vll, whereas the capacitor 53 connected to the drain of the transistor 46 is charged to the potential Vhh. The capacitors 52 and 53 are parasitic capacitors having a small capacitance. During the period while the clock φclp takes the low level, the outputs CMP_P and CMP_N of the comparator 40 both take the low level. An output φinc of an amplifier (inverter) 54 input with the signal CMP_P takes the high level, whereas an output φdec of an amplifier 55 input with the signal CMP_N takes the low level. Therefore, an n-type MOS transistor 56 and a p-type MOS transistor 57 are both turned off whose gates are applied with the signals φdec and φinc respectively. As the clock φclp changes from the low to high level, the comparator 40 compares the voltage Vref with the voltage Vout, and if the voltage Vref is higher, outputs the high level signal CMP_P, whereas if the voltage Vref is lower, outputs the high level signal CMP_N, as described previously. As the signal CMP_P takes the high level, the signal φinc becomes low and the transistor 57 is turned on. Since the signal CMP_N remains low, the signal φdec is low and the transistor 56 remains off.

As the transistor 57 turns on, charges in the parasitic capacitor 53 flow into a capacitor 58 having a sufficiently large capacitance as compared to the parasitic capacitors 53 and 52, so that the voltage Vclp is raised slightly. Conversely, as the signal CMP-N takes the high level, the signal φinc remains high and the signal φdec becomes high so that the transistor 57 turns off and the transistor 56 turns on. A fraction of charges in the capacitor 58 flows out to the parasitic capacitor 52 so that the potential Vclp of the capacitor 58 lowers slightly.

With the above operations, if the voltage Vref is higher than the voltage Vout, the voltage Vclp rises slightly, whereas if the voltage Vout is higher than the voltage Vref, the voltage Vclp lowers slightly. If the voltage Vhh is set to the voltage VV2 lower than the voltage VDD and the voltage Vll is set to the voltage VV1 higher than the ground potential GND by the MODE signal, a change amount of the voltage Vclp becomes smaller than when the voltages $V_{DD}$ and GND are set. Namely, if the MODE signal is high, an output voltage amplitude becomes large, whereas if the MODE signal is low, the output voltage amplitude becomes small. The voltage Vclp is supplied to the gate of the transistor 23 shown in FIG. 2, as described earlier.

Next, switching between convergence modes while the voltage adjusting circuit 24 controls an operating point will be described. Immediately after the gain of the variable gain amplifier circuit is changed, the output voltage Vclp of the voltage adjusting circuit 24 maintains its initial value. Therefore, the bias current Ibp at this time does not provide the operating point suitable for the newly set and changed gain. Therefore, the output operating point may be at a point greatly shifted from the target operating point. In such a case, it is necessary to converge the operating point at high speed in order to obtain a normal operating point as soon as possible.

Generally, in a circuit for obtaining a convergence through discrete (intermittent) feedback as in this embodiment, after an adjustment by an input voltage Vclp is reflected upon the output voltage Vout, the next input voltage Vclp is supplied. This is because the convergence is required to be stabilized. If the next input voltage Vclp is supplied before an adjustment by the preceding input voltage Vclp is reflected upon the output voltage Vout, the circuit operation toward convergence becomes unstable.

If high speed convergence is preferred rather than convergence precision, it is not necessarily required to execute such a convergence operation. In this embodiment of the invention, either high speed convergence or stable convergence is selected by switching between the convergence modes. More specifically, if convergence is to be performed at high speed, the period of the clock φclp is made short, whereas if convergence is to be performed precisely (stably), the period of the clock φclp is made long.

This selection is executed by using the MODE signal. As the MODE signal is high, the high speed convergence mode is used, and as the MODE signal is low, the high precision convergence mode is used. In the high precision convergence mode, an amplitude of the adjusting voltage Vclp is made small to improve stability. The MODE signal for mode switching is generated by a convergence judging circuit 35 shown in FIG. 5 and supplied to the voltage adjusting circuit 24. The MODE signal is also supplied to the φclp generator circuit 50 to change the period of the pulse φclp.

The convergence judging circuit 35 and φclp generator circuit 50 of the clock control circuit 31 will be described with reference to the circuit diagrams shown in FIGS. 8A and 8B and the operation timing chart shown in FIG. 9.

Figure 8A:
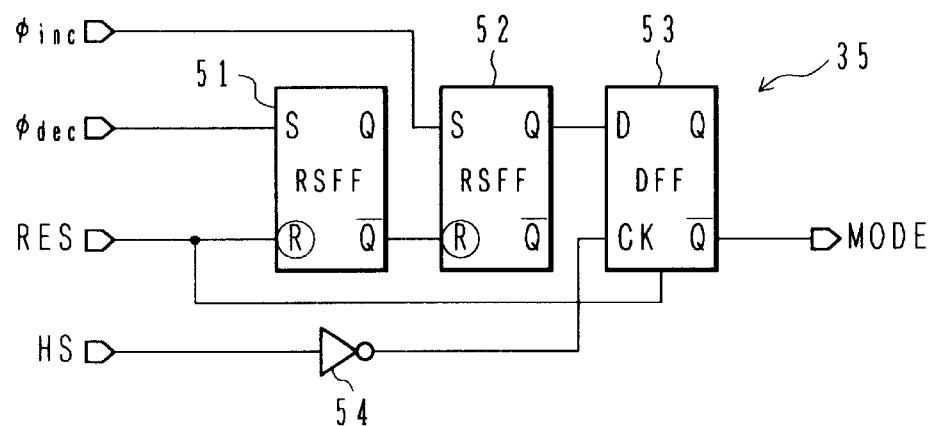
FIGS. 8A and 8B are circuit diagrams of a convergence judging circuit and a φclp generator circuit.

FIG. 8A is a circuit diagram of the convergence judging circuit 35. The convergence judging circuit 35 has RS-type flip-flops 81 and 82, a D-type flip-flop 83 and a NOT gate 84.

When a gain is changed, a RES pulse signal is input to the convergence judging circuit 35 shown in FIG. 8A. At this timing, the MODE signal rises to enter the high speed convergence mode. Thereafter, it is judged from the pulses φinc and φdec whether or not the output operating point of the variable gain amplifier circuit is converged to a predetermined point.

More specifically, until a convergence is established, only one of the pulses φinc and φdec is continuously output from the voltage adjusting circuit 24, and after the convergence is established, the pulses φinc and φdec are alternately output. Therefore, by detecting these pulses, it is possible to judge whether a convergence is established or not. When the pulse φdec is first output after the pulses φinc are output after the convergence judging circuit 35 is reset by the RES pulse signal, this timing TA is judged as the convergence, and at the falling edge of the signal HS, the MODE signal is made low. The operation is switched to the high precision convergence mode during the next high level period of the signal HS.

Figure 8B:
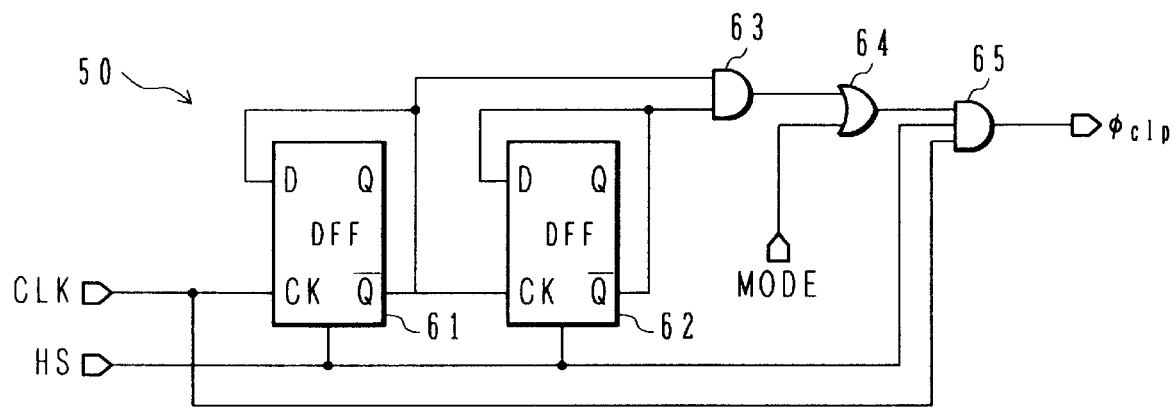

FIG. 8B is a circuit diagram of the φclp generator circuit 50. The φclp generator circuit 50 has D-type flip-flops 85 and 86, AND (Logical product) gates 87 and 89, and an OR (logical sum) gate 88.

Figure 9:
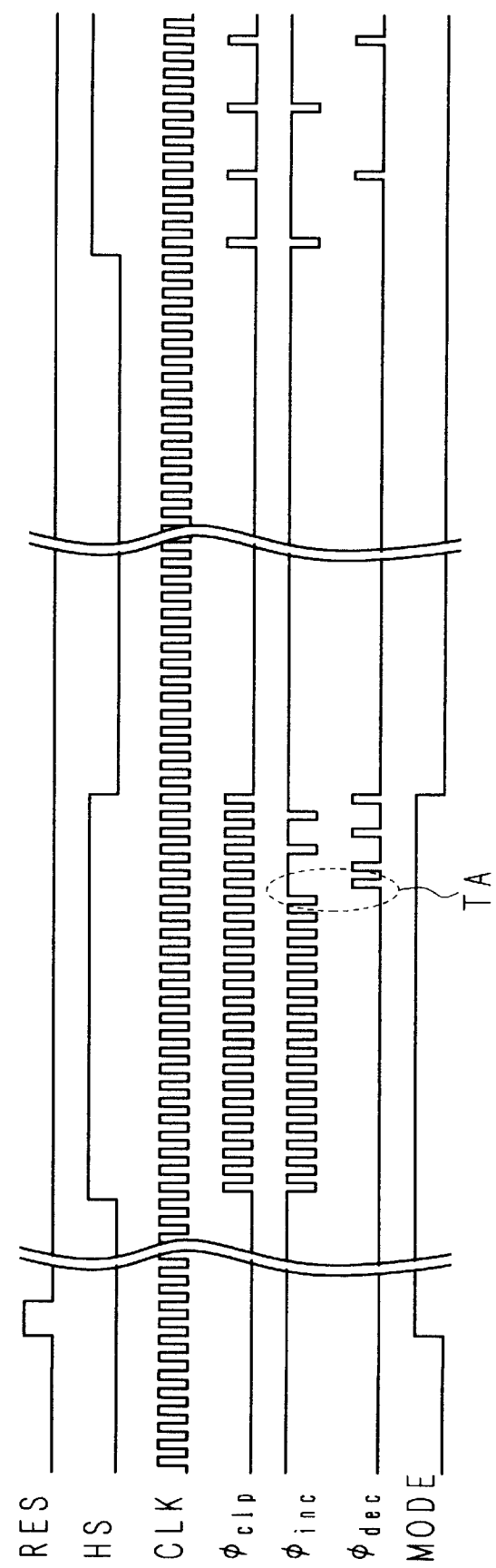
FIG. 9 is an operation timing chart of the clock control circuit.

In the φclp generator circuit 50 shown in FIG. 8B, as seen from the timing chart of FIG. 9, while the MODE signal is high, the pulse φclp is output as an AND operation of the signal HS and clock CLK. While the MODE signal is low, the pulse φclp is output by thinning the pulses obtained by an AND operation of the signal HS and clock CLK by ¼ through masking by an output of a frequency division circuit.

As above, a high speed convergence operation is performed until an output operating point shifted by a change in the gain is converged to a desired operating point, and once a convergence is established, a high precision convergence operation is performed so as to minimize a fluctuation of the output operating point.

Figure 10:
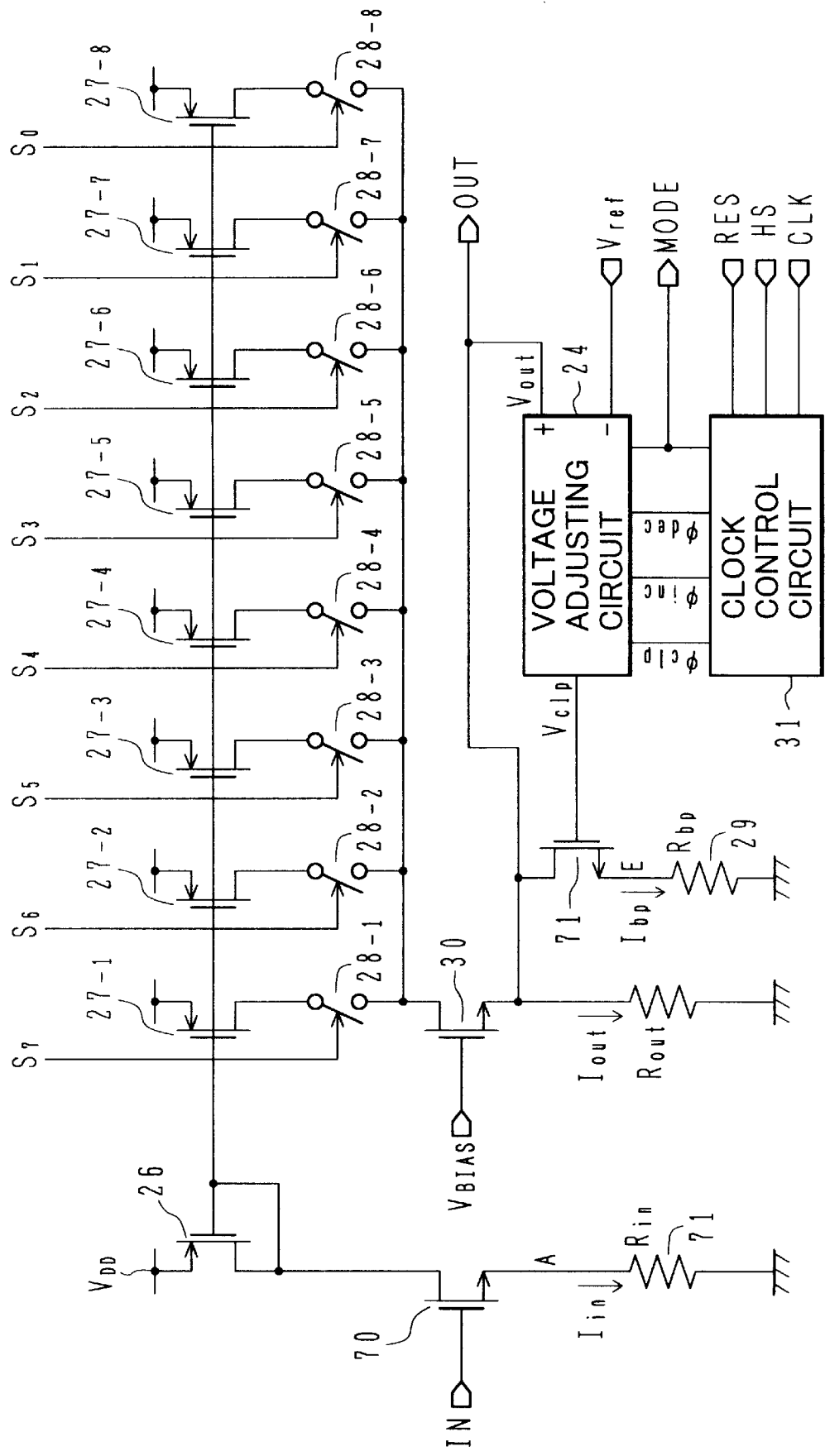
FIG. 10 is a circuit diagram of a variable gain amplifier circuit according to a second embodiment of the invention.
Figure 11:
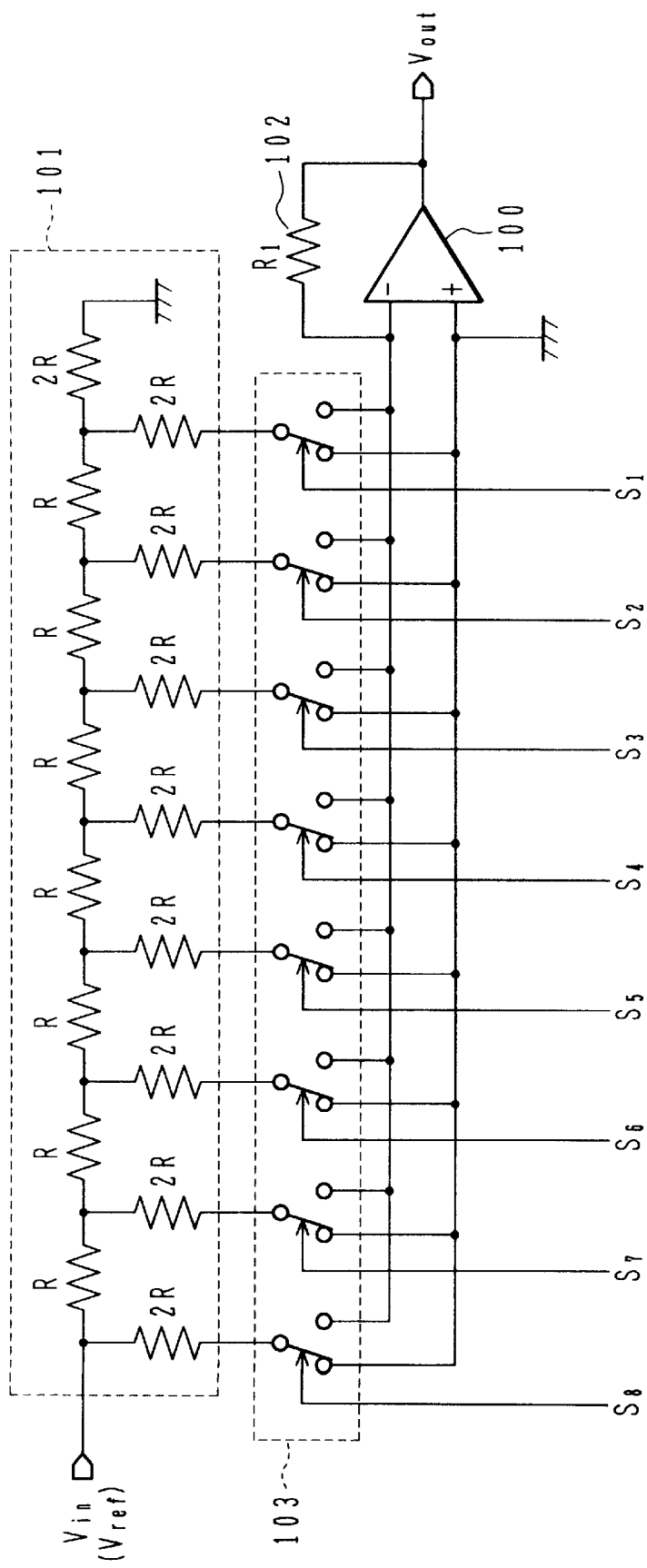
FIG. 11 is a circuit diagram of a conventional variable gain amplifier circuit.

FIG. 10 shows a variable gain amplifier circuit according to a second embodiment of the invention. Different points of the second embodiment from the first embodiment shown in FIG. 2 are that a differential amplifier is not used on the input side and that a current bypass circuit is provided on the output side. In FIG. 10, elements having identical reference numerals to those shown in the circuit diagram of FIG. 2 are basically the same as the elements shown in FIG. 2, and the description thereof is omitted.

Instead of applying an input voltage Vin to a differential amplifier, the input voltage Vin is directly applied to the gate (input terminal IN) of an n-type MOS transistor 70. The potential at a point A is given by the following equation (14) because the transistor 70 and a resistor 71 form a source follower.

$$Vin \times Ao - Vof \quad (14)$$

Symbol A0 represents a gain of the source follower which is about 0.8. Symbol Vof represents offset voltage which is the output voltage when the input voltage is zero. As compared to the first embodiment, the gain is lost at this stage. However, in the first embodiment, the operation bandwidth cannot be broadened greatly because it is necessary to prevent oscillation of a feedback circuit constituted of the differential amplifier 20 and source follower (21, 22). In the second embodiment, the operation bandwidth can be improved considerably because the input voltage Vin is applied directly to the source follower. This embodiment is therefore more suitable for the application which attaches importance to the operation bandwidth.

In the current bias circuit, the equation (5) of the first embodiment is replaced by the following equation (15).

$$Iin = (Ao \times Vin - Vof)/Rin \quad (15)$$

The equation (7) of the first embodiment is replaced by the following equation (16).

$$Isig = Iin \quad (16)$$

The equation (9) of the first embodiment is replaced by the following equation (17).

$$Iout = k \times 2^4 \times Isig - Ibp \quad (17)$$

The equation (11) of the first embodiment is replaced by the following equation (18).

$$Vout = k \times 2^4 \times Rout/Rin \times Ao \times Vin - Vofs \quad (18)$$

The following definition (19) is introduced.

$$Vofs = k \times 2^4 Rout/Rin Vof + Rout \times Ibp \quad (19)$$

In order to set the input/output operating points of Vin=Vin0 and Vout=Vout0, the voltage Vclp is fed back which allows the bypass current Ibp to satisfy the following equation (20). In this manner, the output operating point is established similar to the first embodiment.

$$Ibp = k \times 2^4 \times 1/Rin \times (Ao \times Vin - Vof) - Vout/Rout \quad (20)$$

The voltage Vclp is applied to the gate of an n-type MOS transistor 72. The transistor 72 has a drain connected to an output terminal and a source connected via a resistor 29 to the ground terminal. The bypass current Ibp flows through the resistor 29.

The present invention has been described in connection with the preferred embodiments. The invention is not limited only to the above embodiments. It is apparent that various modifications, improvements, combinations, and the like can be made by those skilled in the art.

What is claimed is:

1. A variable gain amplifier circuit comprising:
   voltage-current conversion means for converting an input voltage into a current and outputting the current;
   current amplifying means, including a plurality of current sources which output respectively different current values based on a given input, for amplifying the current at a set variable gain set by choosing at least one optional current source from among said plurality of current sources;
   means for converting the amplified current into an output voltage; and
   operating point setting means for setting an operating point so that the output voltage converges into a predetermined range during a period while a reference voltage is input.

2. A variable gain amplifier circuit according to claim 1, wherein said voltage-current converting means includes a resistor and a transistor having a gate, a source and a drain, wherein the input voltage is applied to the gate of the transistor and the resistor is connected between the source of the transistor and a reference voltage terminal, and a converted current, which corresponds to the input voltage, flows through the drain of the transistor.

3. A variable gain amplifier circuit according to claim 1, wherein said voltage-current converting means includes: a differential amplifier with a non-inverting input terminal, an inverting input terminal and an output terminal; a resistor; and a transistor with a gate, a source and a drain, wherein the input voltage is applied to the non-inverting terminal of the differential amplifier, the output terminal of the differential amplifier is connected to the gate of the transistor, one end of the resistor is connected to the source of the transistor, another end of the resistor is connected to a reference voltage terminal, and an interconnection between the source of the transistor and the resistor is connected to the inverting input terminal of the differential amplifier.

4. A variable gain amplifier circuit according to claim 1, wherein said current amplifying means includes a current mirror circuit having an input side transistor and an output side transistor, a ratio of a gate width to a gate length of the input side transistor is different from a ratio of a gate width to a gate length of the output side transistor.

5. A variable gain amplifier circuit according to claim 1, wherein said current amplifying means includes a current mirror circuit having one input side transistor and a plurality of output side transistors.

6. A variable gain amplifier circuit according to claim 5, wherein each of the plurality of output side transistors has a different ratio of the gate width to the gate length.

7. A variable gain amplifier circuit according to claim 6, wherein the input side transistor has a ratio of the gate width to the gate length different from a ratio of the gate width to the gate length of each of the plurality of output side transistors.

8. A variable gain amplifier circuit according to claim 5, wherein said current amplifying means includes a switch connected to each of the output side transistors and amplifies a current by controlling an on/off state of the switch.

9. A variable gain amplifier circuit according to claim 5, further comprising a transistor whose source is connected to an output of said current amplifying means, whose gate is applied with a constant voltage, and whose drain is connected to said means for converting the amplified current into an output voltage.

10. A variable gain amplifier circuit according to claim 1, wherein said current-voltage converting means includes a resistor connected to a reference voltage terminal and said current amplifying means.

11. A variable gain amplifier circuit according to claim 1, wherein said operating point setting means includes comparison means for comparing a value of the output voltage with a voltage value at a target operating point and control means for controlling the output voltage to come near the voltage value at the target operating point in accordance with a comparison result by said comparison means.

12. A variable gain amplifier circuit according to claim 1, wherein said operating point setting means includes comparison means for comparing a value of the output voltage with a voltage value at a target operating point and a constant current source for controlling an amount of current flowing to said current amplifying means in accordance with a comparison result by said comparison means.

13. A variable gain amplifier circuit according to claim 1, wherein said operating point setting means includes comparison means for comparing a value of the output voltage with a voltage value at a target operating point and a constant current source for controlling an amount of current flowing to said current-voltage converting means in accordance with a comparison result by said comparison means.

14. A variable gain amplifier circuit according to claim 12, wherein said constant current source includes a transistor having a gate, a source and a drain, wherein the resistor is connected between the source of the transistor and a reference voltage terminal, and current flowing through the drain of the transistor is controlled by a gate voltage of the transistor.

15. A variable gain amplifier circuit according to claim 13, wherein said constant current source includes a transistor having a gate, a source and a drain, wherein the resistor is connected between the source of the transistor and a reference voltage terminal, and current flowing through the drain of the transistor is controlled by a gate voltage of the transistor.

16. A variable gain amplifier circuit according to claim 14, wherein said operating point setting means further comprises means for controlling the gate voltage of the transistor, said gate voltage controlling means including: a first capacitor capable of being precharged to a first reference voltage; a second capacitor capable of being precharged to a second reference voltage; a first switch and a second switch connected to the first and second capacitors; a third capacitor connected to the first and second capacitors via the first and second switches and to the gate of the transistor and having a capacitance larger than a capacitance of each of the first and second capacitors; and switch controlling means for controlling to turn on and off the first and second switches in accordance with the comparison result by said comparison means, and a voltage charged in the third capacitor corresponds to the gate voltage.

17. A variable gain amplifier circuit according to claim 15, wherein said operating point setting means further comprises means for controlling the gate voltage of the transistor, said gate voltage controlling means including: a first capacitor capable of being precharged to a first reference voltage; a second capacitor capable of being precharged to a second reference voltage; a first switch and a second switch connected to the first and second capacitors; a third capacitor connected to the first and second capacitors via the first and second switches and to the gate of the transistor and having a capacitance larger than a capacitance of each of the first and second capacitors; and switch controlling means for controlling to turn on and off the first and second switches in accordance with the comparison result by said comparison means, and a voltage charged in the third capacitor corresponds to the gate voltage.

18. A variable gain amplifier circuit according to claim 16, further comprising clock means for generating a clock signal having a predetermined period, wherein said switch controlling means repetitively controls the first and second switches during a period while the reference voltage is input, in accordance with the predetermined period of the clock supplied from said dock means.

19. A variable gain amplifier circuit according to claim 17, further comprising clock means for generating a clock signal having a predetermined period, wherein said switch controlling means repetitively controls the first and second switches during a period while the reference voltage is input, in accordance with the predetermined period of the clock supplied from said clock means.

20. A variable gain amplifier circuit according to claim 18, further comprising convergence mode setting means for setting a convergence mode and period changing means for changing the predetermined period of the dock signal to be supplied from the dock means in accordance with a set convergence mode.

21. A variable gain amplifier circuit according to claim 19, further comprising convergence mode setting means for setting a convergence mode and period changing means for changing the predetermined period of the dock signal to be supplied from the clock means in accordance with a set convergence mode.

22. A variable gain amplifier circuit according to claim 16, further comprising convergence mode setting means for setting a convergence mode and means for changing at least one of the first and second reference voltages in accordance with a set convergence mode.

23. A variable gain amplifier circuit according to claim 17, further comprising convergence mode setting means for setting a convergence mode and means for changing at least one of the first and second reference voltages in accordance with a set convergence mode.

24. A variable gain amplifier circuit according to claim 1, wherein said voltage-current converting means is supplied with a voltage of an image signal, and said operating point setting means sets the operating point during a blanking period of an image signal.

25. A variable gain amplifier circuit according to claim 1, wherein said operating point setting means comprises a convergence mode adjusting circuit, wherein said convergence mode adjusting circuit outputs a MODE signal for selecting between a high speed convergence mode and a high precision convergence mode.

26. A variable gain amplifier circuit according to claim 1, wherein said operating point setting means comprises a comparator which is feedback controlled, wherein said comparator has two inputs and two outputs, wherein said two outputs are controlled via positive feedback in order to assume their respective binary output states quickly.

27. A variable gain amplifier circuit comprising:
voltage-current conversion means for converting an input voltage into a current and outputting the current, wherein said voltage-current converting means includes a source follower circuit having a resistor and a transistor having a gate, a source and a drain, wherein the input voltage is applied to the gate of the transistor and the resistor is connected between the source of the transistor and a reference voltage terminal;
current amplifying means for amplifying the current at a set variable gain;
means for converting the amplified current into an output voltage; and
operating point setting means for setting an operating point so that the output voltage converges into a predetermined range during a period while a reference voltage is input.

28. A variable gain amplifier circuit comprising:
voltage-current conversion means for converting an input voltage into a current and outputting the current;
current amplifying means for amplifying the current at a set variable gain, wherein said current amplifying means includes a current mirror circuit having an input side transistor and an output side transistor, a ratio of a gate width to a gate length of the input side transistor is different from a ratio of a gate width to a gate length of the output side transistor;

means for converting the amplified current into an output voltage; and operating point setting means for setting an operating point so that the output voltage converges into a predetermined range during a period while a reference voltage is input.

29. A variable gain amplifier circuit comprising:

voltage-current conversion means for converting an input voltage into a current and outputting the current;

current amplifying means for amplifying the current at a set variable gain, wherein said current amplifying means includes a current mirror circuit having one input side transistor and a plurality of output side transistors;

means for converting the amplified current into an output voltage; and operating point setting means for setting an operating point so that the output voltage converges into a predetermined range during a period while a reference voltage is input.

30. A variable gain amplifier circuit according to claim 29, wherein each of the plurality of output side transistors has a different ratio of the gate width to the gate length.

31. A variable gain amplifier circuit according to claim 30, wherein the input side transistor has a ratio of the gate width to the gate length different from a ratio of the gate width to the gate length of each of the plurality of output side transistors.

32. A variable gain amplifier circuit according to claim 29, wherein said current amplifying means includes a switch connected to each of the output side transistors and amplifies a current by controlling an on/off state of the switch.

33. A variable gain amplifier circuit according to claim 29, further comprising a transistor whose source is connected to an output of said current amplifying means, whose gate is applied with a constant voltage, and whose drain is connected to said means for converting the amplified current into an output voltage.

34. A variable gain amplifier circuit comprising:

voltage-current conversion means for converting an input voltage into a current and outputting the current;

current amplifying means for amplifying the current at a set variable gain;

means for converting the amplified current into an output voltage; and operating point setting means for setting an operating point so that the output voltage converges into a predetermined range during a period while a reference voltage is input, wherein said operating point setting means includes comparison means for comparing a value of the output voltage with a voltage value at a target operating point and a constant current source for controlling an amount of current flowing to said current amplifying means in accordance with a comparison result by said comparison means, wherein said constant current source includes a source follower circuit comprising:

a resistor whose one terminal is applied with the reference voltage; and a transistor connected to the resistor, wherein current flowing through the transistor is controlled by a gate voltage of the transistor;

wherein said operating point setting means further comprises means for controlling the gate voltage of the transistor, said gate voltage controlling means comprising:

a first capacitor capable of being precharged to a first reference voltage;

a second capacitor capable of being precharged to a second reference voltage;

a first switch and a second switch connected to the first and second capacitors;

a third capacitor connected to the first and second capacitors via the first and second switches and to the gate of the transistor and having a capacitance larger than a capacitance of each of the first and second capacitors, wherein a voltage charged in the third capacitor corresponds to the gate voltage; and switch controlling means for turning on and off the first and second switches in accordance with the comparison result by said comparison means.

35. A variable gain amplifier circuit comprising:

voltage-current conversion means for converting an input voltage into a current and outputting the current;

current amplifying means for amplifying the current at a set variable gain;

means for converting the amplified current into an output voltage; and operating point setting means for setting an operating point so that the output voltage converges into a predetermined range during a period while a reference voltage is input, wherein said operating point setting means includes comparison means for comparing a value of the output voltage value at a target operating point and a constant current source for controlling an amount of current flowing to said current-voltage converting means in accordance with a comparison result by said comparison means, wherein said constant current source includes a source follower circuit comprising:

a resistor whose one terminal is applied with the reference voltage; and a transistor connected to the resistor, wherein current flowing through the transistor is controlled by a gate voltage of the transistor;

wherein said operating point setting means further comprises means for controlling the gate voltage of the transistor, said gate voltage controlling means comprising:

a first capacitor capable of being precharged to a first reference voltage;

a second capacitor capable of being precharged to a second reference voltage;

a first switch and a second switch connected to the first and second capacitors;

a third capacitor connected to the first and second capacitors via the first and second switches and to the gate of the transistor and having a capacitance larger than a capacitance of each of the first and second capacitors, wherein a voltage charged in the third capacitor corresponds to the gate voltage; and switch controlling means for turning on and off the first and second switches in accordance with the comparison result by said comparison means.

36. A variable gain amplifier circuit according to claim 34, further comprising clock means for generating a clock signal having a predetermined period, wherein said switch controlling means repetitively controls the first and second switches during a period while the reference voltage is input, in accordance with the predetermined period of the clock supplied from said clock means.

37. A variable gain amplifier circuit according to claim 35, further comprising clock means for generating a clock signal having a predetermined period, wherein said switch controlling means repetitively controls the first and second switches during a period while the reference voltage is input, in accordance with the predetermined period of the clock supplied from said clock means.

38. A variable gain amplifier circuit according to claim 36, further comprising convergence mode setting means for setting a convergence mode and period changing means for changing the predetermined period of the clock signal to be supplied from the clock means in accordance with a set convergence mode.

39. A variable gain amplifier circuit according to claim 37, further comprising convergence mode setting means for setting a convergence mode and period changing means for changing the predetermined period of the clock signal to be supplied from the clock means in accordance with a set convergence mode.

40. A variable gain amplifier circuit according to claim 34, further comprising convergence mode setting means for setting a convergence mode and means for changing at least one of the first and second reference voltages in accordance with a set convergence mode.

41. A variable gain amplifier circuit according to claim 35, further comprising convergence mode setting means for setting a convergence mode and means for changing at least one of the first and second reference voltages in accordance with a set convergence mode.

* * * * *